United States Patent
Hsu et al.

(10) Patent No.: US 11,581,436 B2
(45) Date of Patent: Feb. 14, 2023

(54) NEGATIVE CAPACITANCE TRANSISTOR WITH A DIFFUSION BLOCKING LAYER

(71) Applicant: Taiwan Semiconductor Manufacturing Co., Ltd., Hsinchu (TW)

(72) Inventors: Chi-Hsing Hsu, New Taipei (TW); Ching-Wei Tsai, Hsinchu (TW); Kuan-Lun Cheng, Hsin-Chu (TW); Chih-Hao Wang, Hsinchu County (TW); Sai-Hooi Yeong, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 56 days.

(21) Appl. No.: 17/113,821

(22) Filed: Dec. 7, 2020

(65) Prior Publication Data

US 2021/0098618 A1    Apr. 1, 2021

Related U.S. Application Data

(63) Continuation of application No. 16/284,871, filed on Feb. 25, 2019, now Pat. No. 10,861,973.

(60) Provisional application No. 62/690,659, filed on Jun. 27, 2018.

(51) Int. Cl.
| | |
|---|---|
| *H01L 29/78* | (2006.01) |
| *H01L 29/66* | (2006.01) |
| *H01L 27/088* | (2006.01) |
| *H01L 29/06* | (2006.01) |

(52) U.S. Cl.
CPC ........ *H01L 29/785* (2013.01); *H01L 27/0886* (2013.01); *H01L 29/0653* (2013.01); *H01L 29/6684* (2013.01); *H01L 29/66795* (2013.01); *H01L 29/7848* (2013.01); *H01L 29/78391* (2014.09)

(58) Field of Classification Search
CPC ............. H01L 29/785; H01L 29/78391; H01L 29/0653; H01L 29/66795; H01L 29/6684; H01L 29/7848; H01L 27/0886
USPC ....................................................... 257/347
See application file for complete search history.

(56) References Cited

U.S. PATENT DOCUMENTS

| | | | |
|---|---|---|---|
| 6,238,933 B1 | 5/2001 | Sun et al. | |
| 6,674,138 B1 * | 1/2004 | Halliyal | H01L 29/66833 257/314 |
| 7,667,271 B2 | 2/2010 | Yu et al. | |
| 8,362,575 B2 | 1/2013 | Kwok et al. | |
| 8,367,498 B2 | 2/2013 | Chang et al. | |
| 8,440,517 B2 | 5/2013 | Lin et al. | |

(Continued)

OTHER PUBLICATIONS

Muller, Johannes, et al., "Ferroelectricity in Simple Binary ZrO2 and HfO2", Nano Letters, 2012, pp. 4318-4323, 12, American Chemical Society.

*Primary Examiner* — Tu-Tu V Ho
(74) *Attorney, Agent, or Firm* — Haynes and Boone, LLP

(57) ABSTRACT

A semiconductor device includes a substrate. The semiconductor device includes a dielectric layer disposed over a portion of the substrate. The semiconductor device includes a diffusion blocking layer disposed over the dielectric layer. The diffusion blocking layer and the dielectric layer have different material compositions. The semiconductor device includes a ferroelectric layer disposed over the diffusion blocking layer.

20 Claims, 11 Drawing Sheets

(56) References Cited

U.S. PATENT DOCUMENTS

| | | |
|---|---|---|
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,711,533 B2 | 7/2017 | Ching et al. |
| 9,978,868 B2 | 5/2018 | Lai et al. |
| 2004/0211998 A1 | 10/2004 | Araujo et al. |
| 2007/0051999 A1 | 3/2007 | Shin et al. |
| 2008/0073680 A1* | 3/2008 | Wang ............... H01L 27/11502 257/295 |
| 2011/0068407 A1 | 3/2011 | Yeh et al. |
| 2013/0011983 A1 | 1/2013 | Tsai et al. |
| 2014/0252412 A1 | 9/2014 | Tsai et al. |
| 2017/0141235 A1 | 5/2017 | Lai et al. |
| 2018/0342622 A1 | 11/2018 | Zhu et al. |
| 2019/0346404 A1 | 11/2019 | Tan et al. |
| 2020/0006547 A1 | 1/2020 | Hsu et al. |

\* cited by examiner

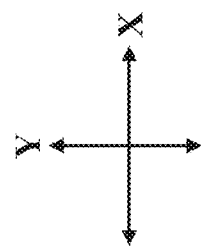
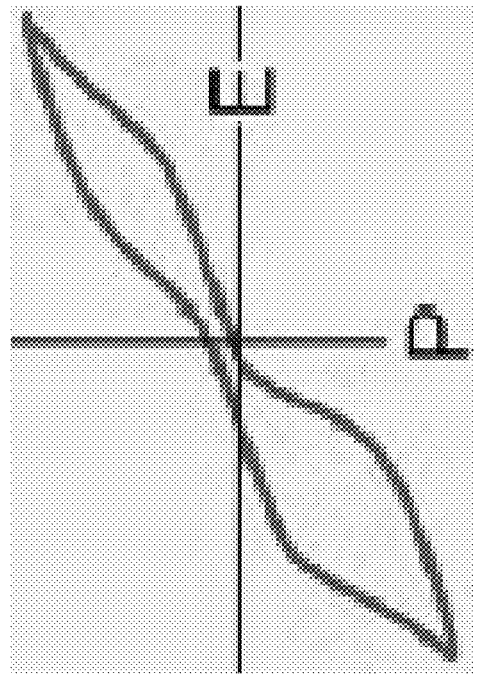
Fig. 9B
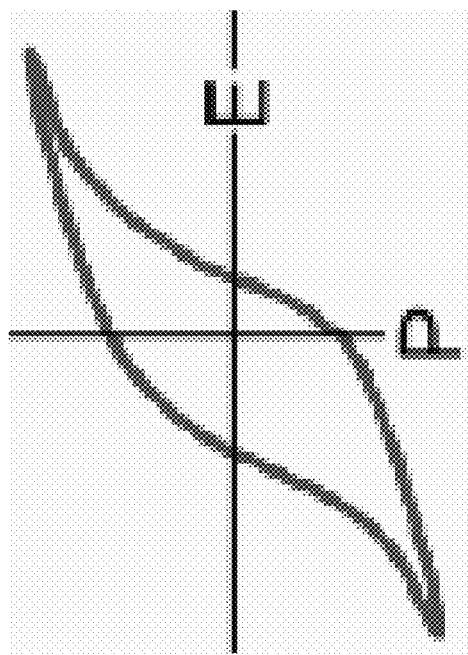
Fig. 9C
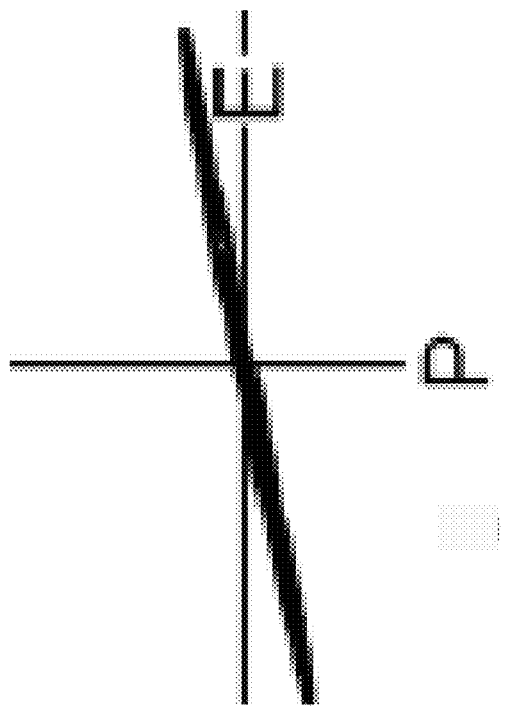
Fig. 9A

NEGATIVE CAPACITANCE TRANSISTOR WITH A DIFFUSION BLOCKING LAYER

PRIORITY DATA

This present application is a continuation of U.S. patent application Ser. No. 16/284,871, filed Feb. 25, 2019, which is a utility application of Provisional U.S. Patent Application No. 62/690,659, filed Jun. 27, 2018, entitled "NEGATIVE CAPACITANCE TRANSISTOR WITH A DIFFUSION BLOCKING LAYER", the disclosure of which is hereby incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor. Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. However, existing methods and devices have not been able to form a gate stack with satisfactory negative capacitance performance.

Therefore, although existing methods of fabricating IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 9B, and 9C illustrate remanent polarization v.s. coercive field plots of various materials.

DETAILED DESCRIPTION

Figure 1:
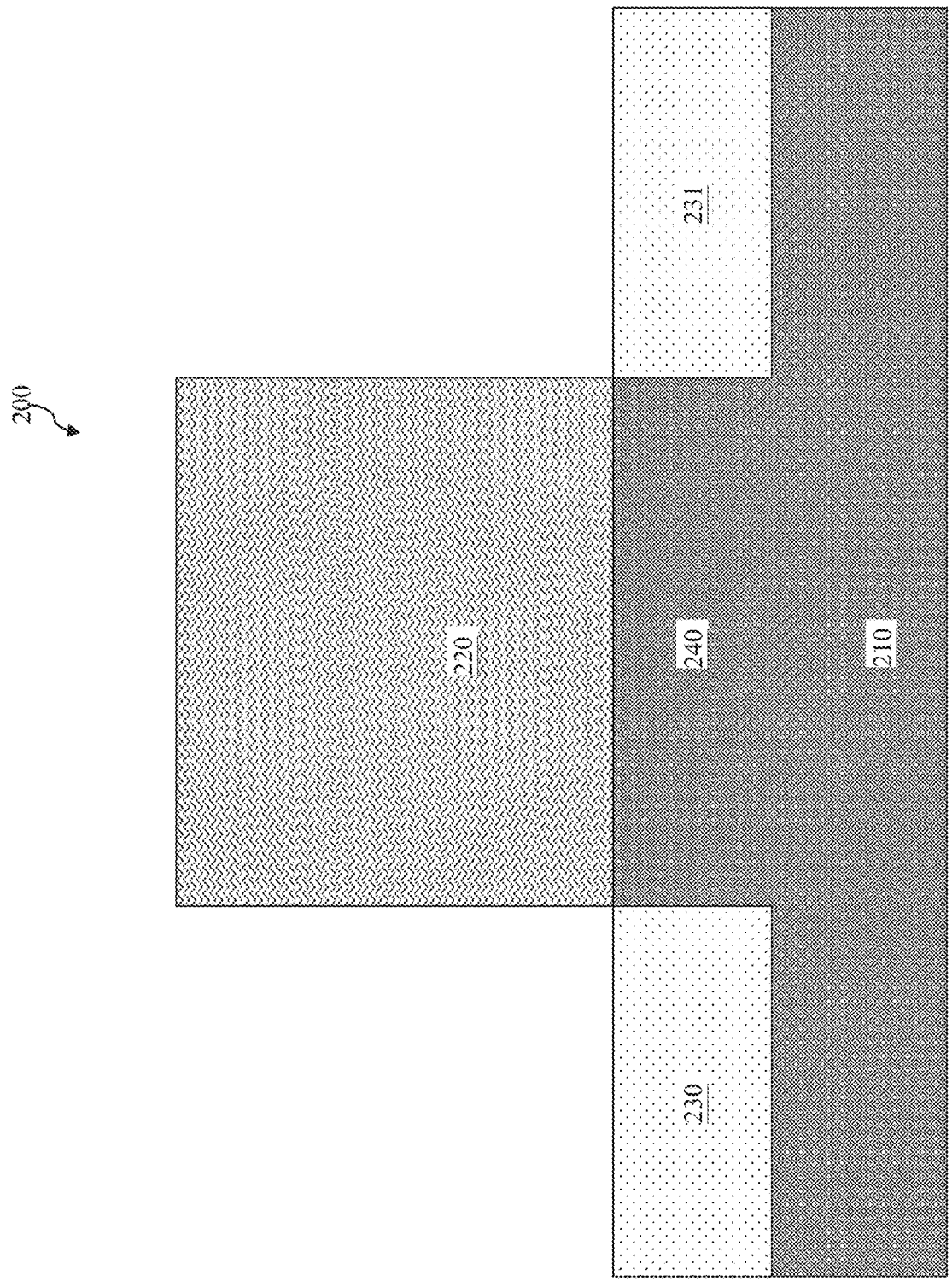
FIGS. 1-7 and 7A are cross-sectional views of an example semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Integrated Circuit (IC) devices have been evolving rapidly over the last several decades. A typical IC chip may include numerous active devices such as transistors and passive devices such as resistors, inductors, and capacitors. Recently, negative capacitance devices have been made at least in part via the fabrication of field effect transistors (FETs). In more detail, a negative capacitance device may be formed using a gate structure of a FET device that includes a ferroelectric film. Negative capacitance devices may offer advantages, such as lower subthreshold swing. Subthreshold swing represents the ease of switching the transistor current off and on and is a factor in determining the switching speed of a FET device. Subthreshold swing allows for FET devices having higher switching speed compared to conventional FET devices. Negative capacitance devices may be utilized in application in metal-oxide-semiconductor field-effect transistors (MOSFETs) with very short channel length for ultra-low power computing. However, negative capacitance devices may suffer from undesirable diffusion of dopants from a ferroelectric film into the materials therebelow, which may degrade the performance of the negative capacitance device. Furthermore, negative capacitance devices may be constrained by a small capacitance matching window.

To overcome the problems discussed above, the present disclosure pertains to a negative capacitance device having improved performance as well as flexible capacitance tuning. For example, the present disclosure implements a gate structure (e.g., a gate structure of a FET transistor) that includes: a high-k dielectric layer, a ferroelectric film disposed over the high-k dielectric layer, a metal gate electrode disposed over the ferroelectric film, and a diffusion blocking layer sandwiched between the high-k dielectric layer and the ferroelectric film.

The diffusion blocking layer is one of the unique aspects of the present disclosure, as it prevents (or at least reduces) an undesirable diffusion of dopants from the ferroelectric film into the materials therebelow during thermal processes, for example diffusion into the high-k dielectric layer or even into a channel region (below the high-k dielectric layer) of the transistor. The elimination or reduction of this undesirable dopant diffusion helps prevent the high-k dielectric layer and/or the channel region from being otherwise contaminated by the dopants. As a result, the quality of the high-k dielectric layer and the channel region is enhanced, and the ferroelectric film itself can also achieve a more stable crystalline phase and quality, thereby improving overall device performance.

The implementation of the diffusion blocking layer also provides an additional degree of freedom (or an extra capacitance matching parameter) in tuning the capacitance of the negative capacitance transistor. For example, the material composition and/or the thickness of the diffusion blocking layer can be configured to flexibly tune the capacitance of the negative capacitance device. Consequently, the present disclosure can widen the capacitance matching window of the negative capacitance transistor without creating hysteresis, which would have been undesirable. The various aspects of the present disclosure are now discussed in more detail below with reference to FIGS. 1-9.

FIGS. 1-7 are diagrammatic fragmentary cross-sectional side views of a semiconductor device 200 at various stages of fabrication in accordance with some embodiments. Referring now to FIG. 1, the semiconductor structure 200 includes a substrate 210. The substrate 210 includes silicon in some embodiments. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may also include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED).

The substrate 210 may also include various electrical isolation regions. The electrical isolation regions provide electrical isolation between various device regions (such as the doped regions) in the substrate 210. The electrical isolation regions may include different structures formed by using different processing technologies. For example, the electrical isolation regions may include shallow trench isolation (STI) structures. The formation of an STI structure may include etching a trench in the substrate 210 and filling in the trench with one or more insulator materials such as silicon oxide, silicon nitride, silicon oxynitride, or combinations thereof. The filled trench may have a multi-layer structure such as a thermal oxide liner layer with silicon nitride filling the trench. A polishing or planarization process such as chemical mechanical polishing (CMP) may be performed to polish back excessive insulator materials and planarize the top surface of the isolation features.

A dummy gate structure 220 is formed over a portion of the substrate 210. In some embodiments, the dummy gate structure 220 includes a dummy gate dielectric and a dummy gate electrode. The dummy gate dielectric may include silicon oxide, and the dummy gate dielectric may include polysilicon. The dummy gate structure 220 may be formed by forming a dummy gate dielectric layer and a dummy gate electrode layer and pattern the dummy gate dielectric layer and the dummy gate electrode layer. The dummy gate structure 220 may further include gate spacers formed on sidewalls of the dummy gate electrode and the dummy gate dielectric. For reasons of simplicity, the gate spacers are not specifically illustrated herein.

Source/drain regions are then formed on opposite sides of the dummy gate structure 220. For example, a source region 230 is formed in the substrate 210 and on the "left" side of the dummy gate structure 220 in FIG. 1, and a drain region 231 is formed in the substrate 210 and on the "right" side of the dummy gate structure 220 in FIG. 1. The source region 230 and the drain region 231 may be formed by one or more ion implantation processes, in which N-type or P-type dopant ions are implanted in the substrate 210, depending on the type of substrate 210 and the type of transistor desired (e.g., NFET or PFET). A channel region 240 is defined as a portion of the substrate 210 that is located between the source region 230 and the drain region 231. It is understood that the source region 230, the drain region 231, and the channel region 240 are components of a negative capacitance FET device. It is also understood that the source region 230 and the drain region 231 may be separated from adjacent doped features (e.g., other source/drain regions of nearby transistors) by electrical isolation regions such as STIs.

Figure 2:
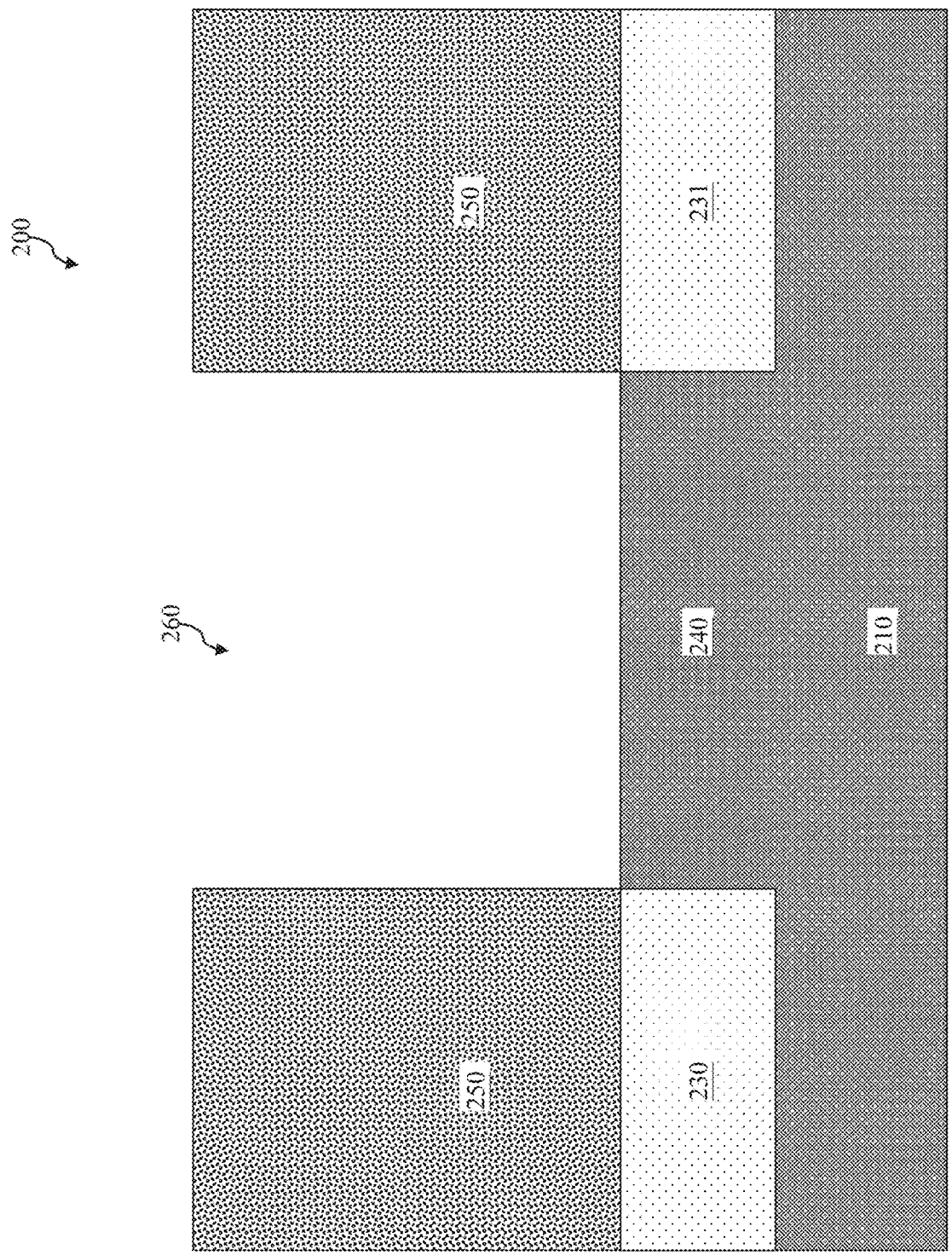

Referring now to FIG. 2, an interlayer dielectric (ILD) 250 is formed over the source and drain regions 230-231 and around the dummy gate structure 220. In some embodiments, the ILD 250 includes a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD 250 may include silicon oxide or silicon nitride, or combinations thereof. The dummy gate structure 220 is then removed to form an opening 260 in place of the removed dummy gate structure 220. As a part of a gate replacement process, the opening 260 will be filled by a functional gate structure that includes a high-k gate dielectric and a metal gate electrode, as well as a ferroelectric film and a diffusion blocking layer, as discussed below in more detail.

Figure 3:
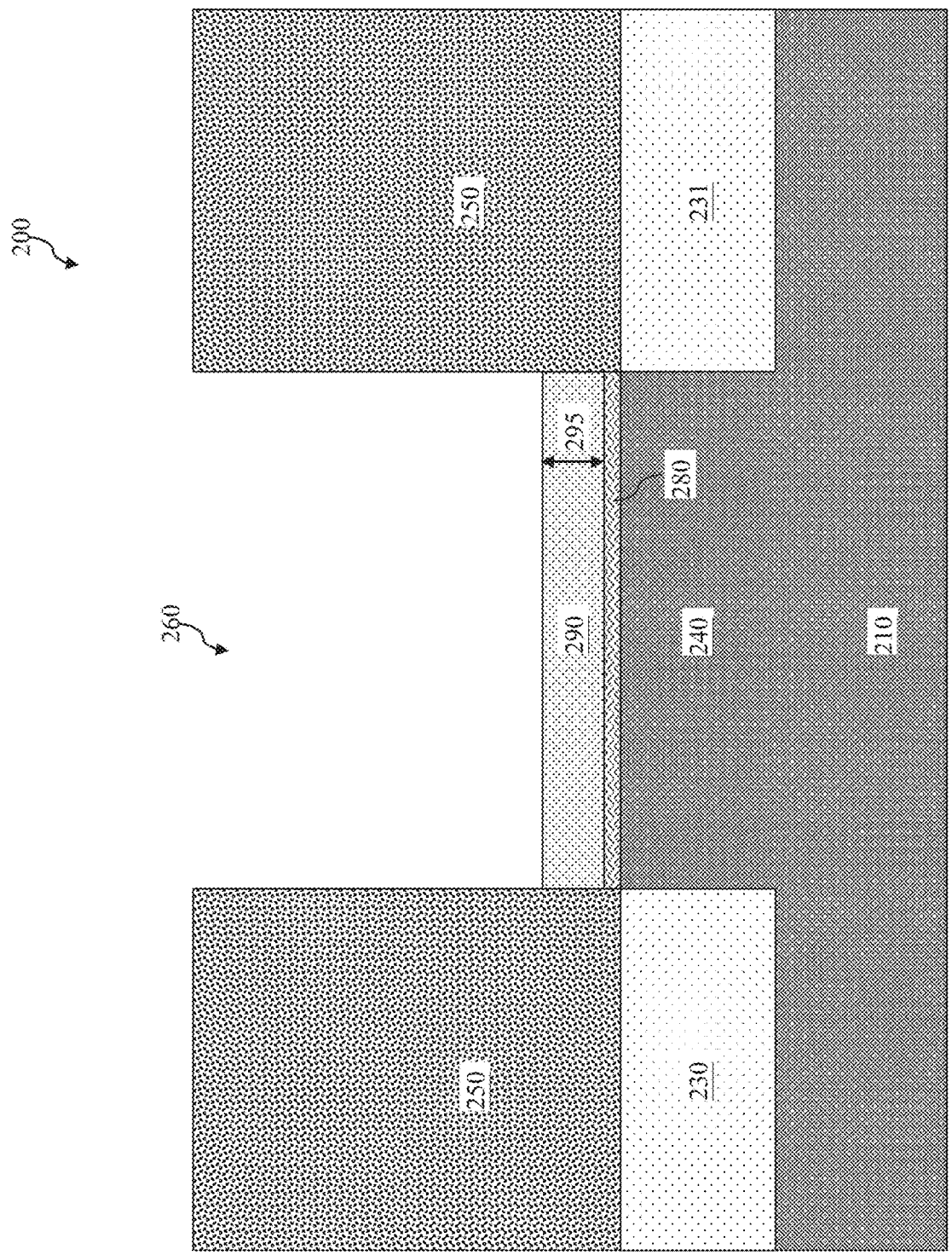

Referring now to FIG. 3, an interfacial layer 280 is formed over the channel region 240 in the opening 260. In some embodiments, the interfacial layer 280 includes an oxide material such as silicon oxide. The interfacial layer 280 serves as an interface between the channel and the gate structure (to be formed by the subsequent processes).

A high-k dielectric layer 290 is then formed in the opening 260 and over the interfacial layer 280. The high-k dielectric layer 290 may serve as a part of a gate dielectric component of a high-k metal gate (HKMG) structure. In some embodiments, the high-k dielectric layer 290 may include a material having a dielectric constant that is greater than a dielectric constant of SiO$_2$, which is approximately 4. In an embodiment, the high-k dielectric layer 290 includes hafnium oxide (HfO$_2$), which has a dielectric constant that is in a range from approximately 18 to approximately 40. In alternative embodiments, the high-k gate dielectric may include ZrO$_2$, Y$_2$O$_3$, La$_2$O$_5$, Gd$_2$O$_5$, TiO$_2$, Ta$_2$O$_5$, HfErO, HfLaO, HfYO, HfGdO, HfAlO, HfZrO, HfTiO, HfTaO, or SrTiO. The high-k dielectric layer 290 may be formed by a suitable deposition process. In some embodiments, the deposition process includes an atomic layer deposition (ALD) process, which may be performed in a temperature range from about 200 degrees Celsius and about 400 degrees Celsius. The mechanism of the ALD process may help control a thickness 295 of the high-k dielectric layer 290 with better precision and uniformity, and a relatively low process temperature (e.g., compare to other types of deposition processes) of the ALD process helps the fabrication of the semiconductor device 200 stay within a specified thermal budget. In some embodiments, the thickness 295 is configured to be in a range from about 1 nanometer (nm) to about 3 nm. However, the deposition used to form the high-k dielectric layer 290 is not limited to ALD. For example, in other embodiments, the high-k dielectric layers 290 may be formed by deposition processes such a chemical vapor deposition (CVD), plasma enhanced chemical vapor deposition (PECVD), metal-organic chemical vapor deposition (MOCVD), physical vapor deposition (PVD), etc.

Figure 4:
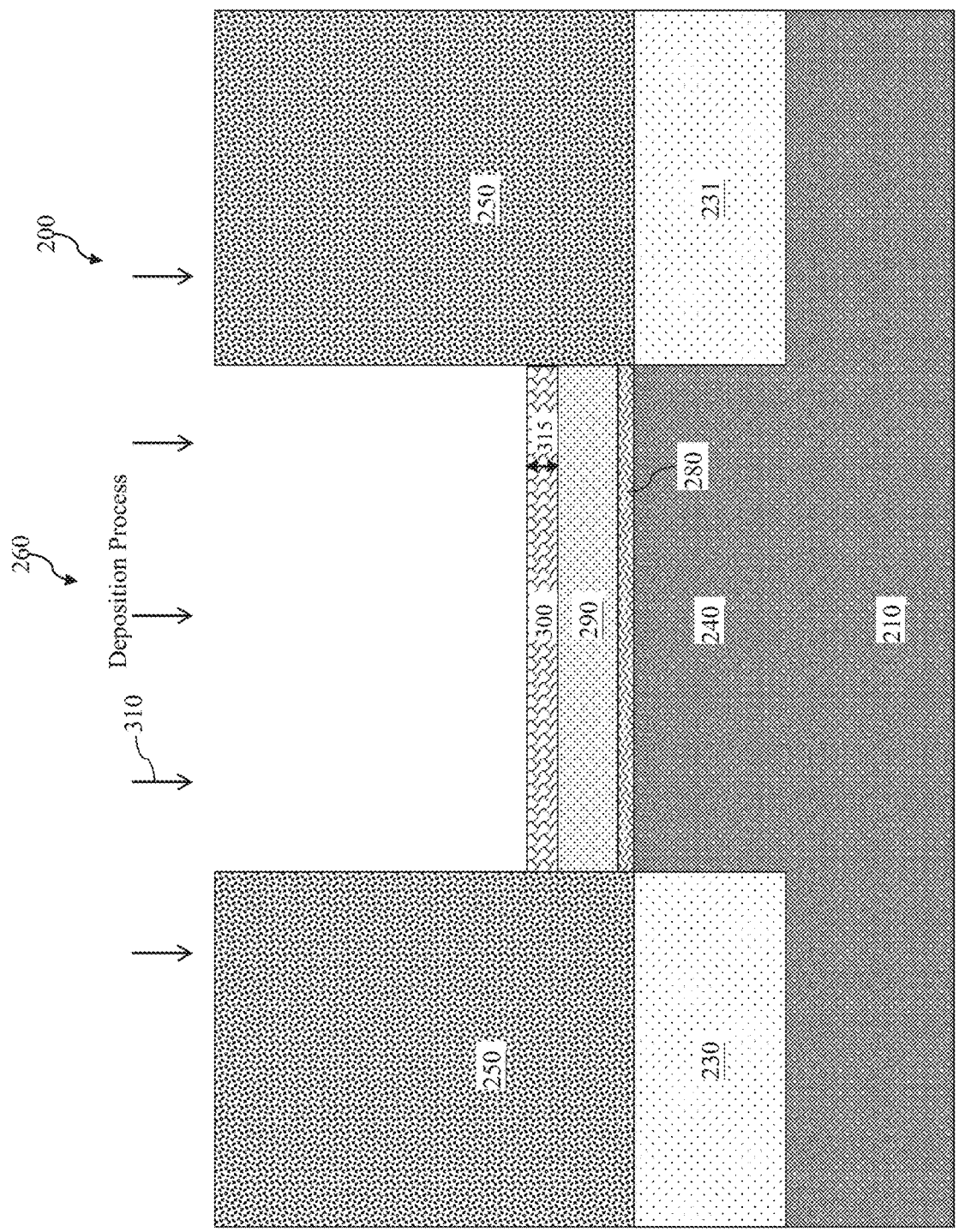

Referring now to FIG. 4, a diffusion blocking layer 300 is formed in the opening 260 and over the high-k dielectric layer 290. The diffusion blocking layer 300 may be formed by a deposition process 310. In some embodiments, the deposition process 310 includes an ALD process, which as discussed above may help control a thickness of the diffusion blocking layer 300 with better precision and improved uniformity. For example, a thickness 315 of the diffusion blocking layer 300 is configured (e.g., by the deposition process 310) to be in a range from about 1 nm to about 3 nm. This thickness range allows the diffusion blocking layer 300 to adequately serve its purposes. As a non-limiting example, the diffusion blocking layer 300 may advantageously prevent or reduce dopant diffusion from a ferroelectric layer formed thereabove into the high-k dielectric layer 290 disposed therebelow. This is because the material composition of the diffusion blocking layer 300 is configured to be a more stable material that does not react with the dopant of the ferroelectric layer. For example, in embodiments where the ferroelectric layer is a hafnium-based layer that is doped with a zirconium dopant, the diffusion blocking layer 300 may be configured to include aluminum oxide. Aluminum oxide is more stable than the high-k dielectric layer 290 below and does not react with the zirconium dopant, and as such the zirconium dopant will be blocked.

As another non-limiting example, the diffusion blocking layer 300 may advantageously provide more flexibility in capacitance matching for a gate structure. These roles or functionalities of the diffusion blocking layer 300 will be discussed in more detail below. The value range of the thickness 315 is optimized. For example, if the thickness 315 is too thin, it may not be able to sufficiently block the dopant diffusion. On the other hand, if the thickness 315 is too thick, it may unduly increase overall gate height, as well as possibly interfering with the intended operations of the transistor. In some embodiments, the deposition process 310 may be performed at a temperature range from about 200 degrees Celsius and about 400 degrees Celsius. As discussed above, this relatively low deposition process temperature helps the control of a thermal budget during the fabrication of the semiconductor device 200.

It is understood that other types of deposition such as CVD, PECVD, MOCVD, or PVD may be used to form the diffusion blocking layer as well. It is also understood that although FIG. 4 illustrates one diffusion blocking layer 300, additional diffusion blocking layers may be implemented in alternative embodiments. Stated differently, the diffusion blocking layer 300 may include one layer of a diffusion blocking material, or it may include a plurality of sub-layers each having a different diffusion blocking material.

The diffusion blocking layer 300 has a material composition different than the high-k dielectric layer 290 but is also formed to have a relatively high (e.g., compared to silicon oxide) dielectric constant. In some embodiments, the dielectric constant of the diffusion blocking layer 300 is in a range from about 15 to about 60. In some embodiments, the diffusion blocking layer 300 includes a metal oxide material such as aluminum oxide (Al$_2$O$_3$), tantalum oxide (Ta$_2$O$_5$), titanium oxide (TiO$_2$), lanthanum oxide (La$_2$O$_3$), or praseodymium oxide (Pr$_2$O$_3$), and/or the nitride films thereof, and/or combinations thereof. The presence of the diffusion blocking layer 300 can be detected by techniques such as Transmission electron microscopy (TEM, which is a microscopy technique in which a beam of electrons is transmitted through a specimen to form an image) and/or Energy-dispersive X-ray spectroscopy (EDX, which utilizes an interaction of a source of X-ray excitation and a sample to determine a material composition of the sample).

It is understood that one difference between the present disclosure and conventional devices where a high-k dielectric material may be used to implement the gate dielectric layer is that, the present disclosure implements the diffusion blocking layer 300 using a different high-k dielectric material than the high-k dielectric material used to implement the gate dielectric layer. For example, if the gate dielectric material includes hafnium oxide, the present disclosure may use aluminum oxide (as a non-limiting example) to implement the diffusion blocking layer 300. As another example, if the gate dielectric material includes aluminum oxide, the present disclosure may use tantalum oxide (as a non-limiting example) to implement the diffusion blocking layer 300.

Figure 5:
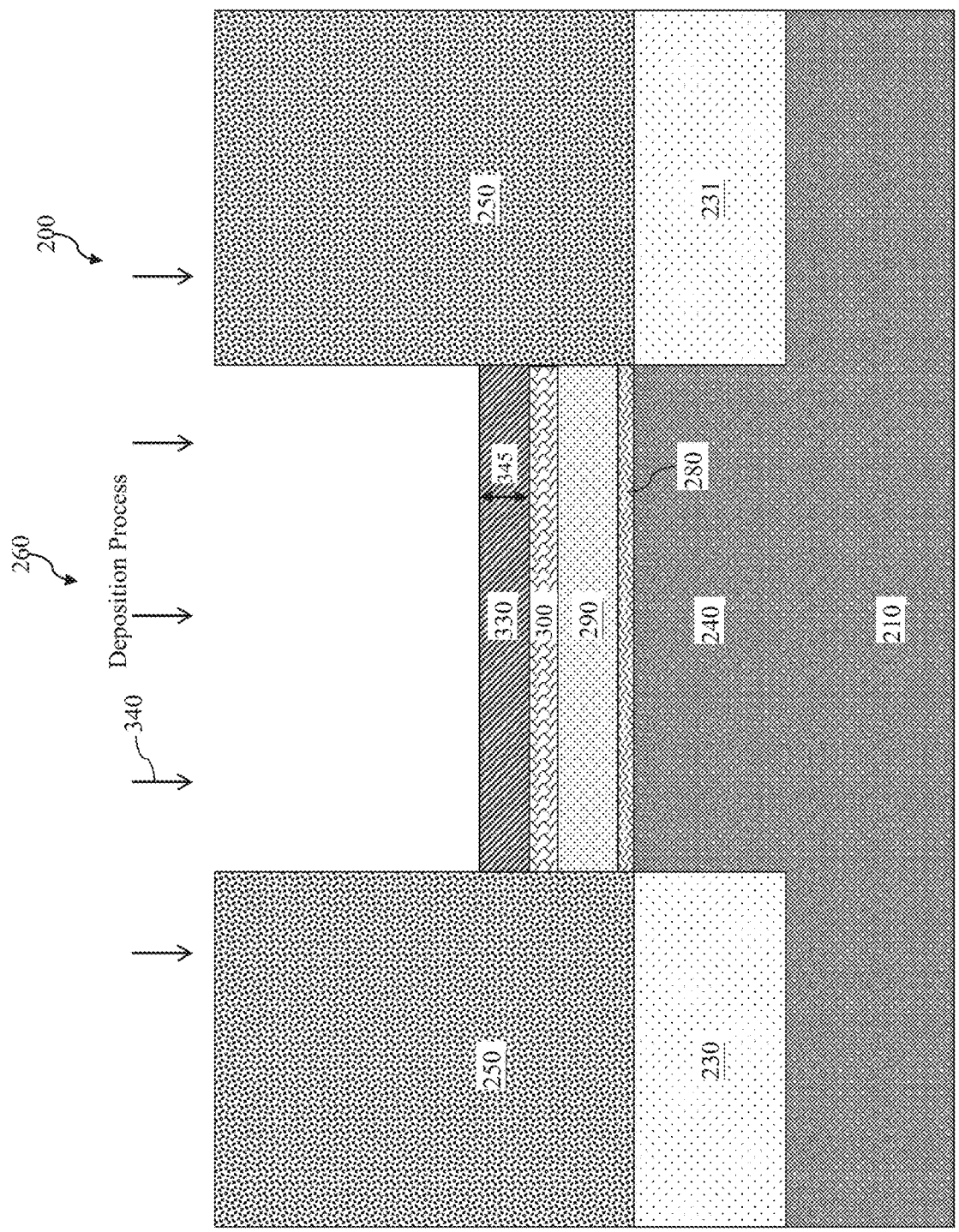

Referring now to FIG. 5, a ferroelectric film 330 is formed in the opening 260 and over the diffusion blocking layer 300. The ferroelectric film 330 may be formed by a deposition process 340. In some embodiments, the deposition process 340 includes an ALD process, which as discussed above may help control a thickness of the ferroelectric film 330 with better precision and improved uniformity. For example, a thickness 345 of the ferroelectric film 330 is configured (e.g., by the deposition process 340) to be in a range from about 1 nm to about 10 nm. This thickness range allows the ferroelectric film 330 to achieve negative capacitance and/or amplify a gate voltage. In some embodiments, the deposition process 340 may be performed at a temperature range from about 200 degrees Celsius and about 400 degrees Celsius. As discussed above, this relatively low deposition process temperature helps the control of a thermal budget during the fabrication of the semiconductor device 200. In other embodiments, other types of deposition such as CVD, PECVD, MOCVD, or PVD may be used to form the ferroelectric film 330.

In some embodiments, the ferroelectric film 330 includes hafnium zirconium oxide, hafnium silicon oxide, hafnium aluminum oxide, lead zirconium titanium oxide, or barium titanium oxide, or combinations thereof. The formation of the ferroelectric film 330 also includes a doping step, in which the deposited ferroelectric film 330 is doped with dopants. For example, the ferroelectric film 330 may be doped (e.g., via an implantation process and/or a diffusion process) with dopants such as zirconium (Zr), silicon (Si), aluminum (Al), lead (Pb), barium (Ba), titanium (Ti), and/or polymers for organic ferroelectric materials. Had the diffusion blocking layer 300 not been formed, the ferroelectric film 330 would have been in direct physical contact with the high-k dielectric layer 290. As a result, the dopants from the ferroelectric film 330 may easily diffuse into the high-k dielectric layer 290, and possibly even into the interfacial layer 280 or into the channel region 240. The dopant diffusion problem may be even more pronounced or exacerbated during thermal processes. For example, a high temperature annealing processes (e.g., performed at a temperature of several hundred degrees Celsius) may be performed after (or as a part of) the formation of the ferroelectric film 330. Additional annealing processes may be performed during the formation of a gate electrode (discussed later in more detail). The higher temperatures of the annealing processes provide an energy boost for the dopants, which may make it easier for them to move about and potentially diffuse into the various layers therebelow, such as the high-k dielectric layer 290, the interfacial layer 280, and/or the channel region 240. When such dopant diffusion occurs, the high-k dielectric layer 290 and/or the interfacial layer 280 may be considered contaminated, which may degrade the quality of these layers and/or disrupt their intended functionalities.

Here, the implementation of the diffusion blocking layer 300—sandwiched in between the ferroelectric film 330 and the high-k dielectric layer 290 layer—prevents or at least reduces the dopant diffusion from the ferroelectric film 330. The reduction of dopant diffusion is due at least in part to the nature of the various films, where an interface of a ferroelectric material and a high-k dielectric material such as HfO provides an easy path for the dopants to diffuse, but an interface of a ferroelectric material and a diffusion blocking material such as $Al_2O_3$ makes it more difficult for the dopants to diffuse. For example, as discussed above, $Al_2O_3$ does not react with a zirconium dopant of a hafnium based ferroelectric film and thus can adequately block the diffusion of the zirconium dopant. Of course, similar mechanisms apply when the ferroelectric films 330 and the diffusion blocking layer 300 are implemented with other types of materials. Furthermore, the interfaces formed between materials such as $Al_2O_3$ (example material of the diffusion blocking layer 300) and a ferroelectric material and between $Al_2O_3$ and a high-k dielectric material are typically better in quality than an interface formed between $Al_2O_3$ and a high-k dielectric material, and this will also reduce the interface mixing between the various layers, which could have degraded device quality otherwise. Thus, by configuring the material composition of the diffusion blocking layer 300 to prevent or reduce dopant diffusion from the ferroelectric layer 330, the present disclosure can improve device performance.

Figure 6:
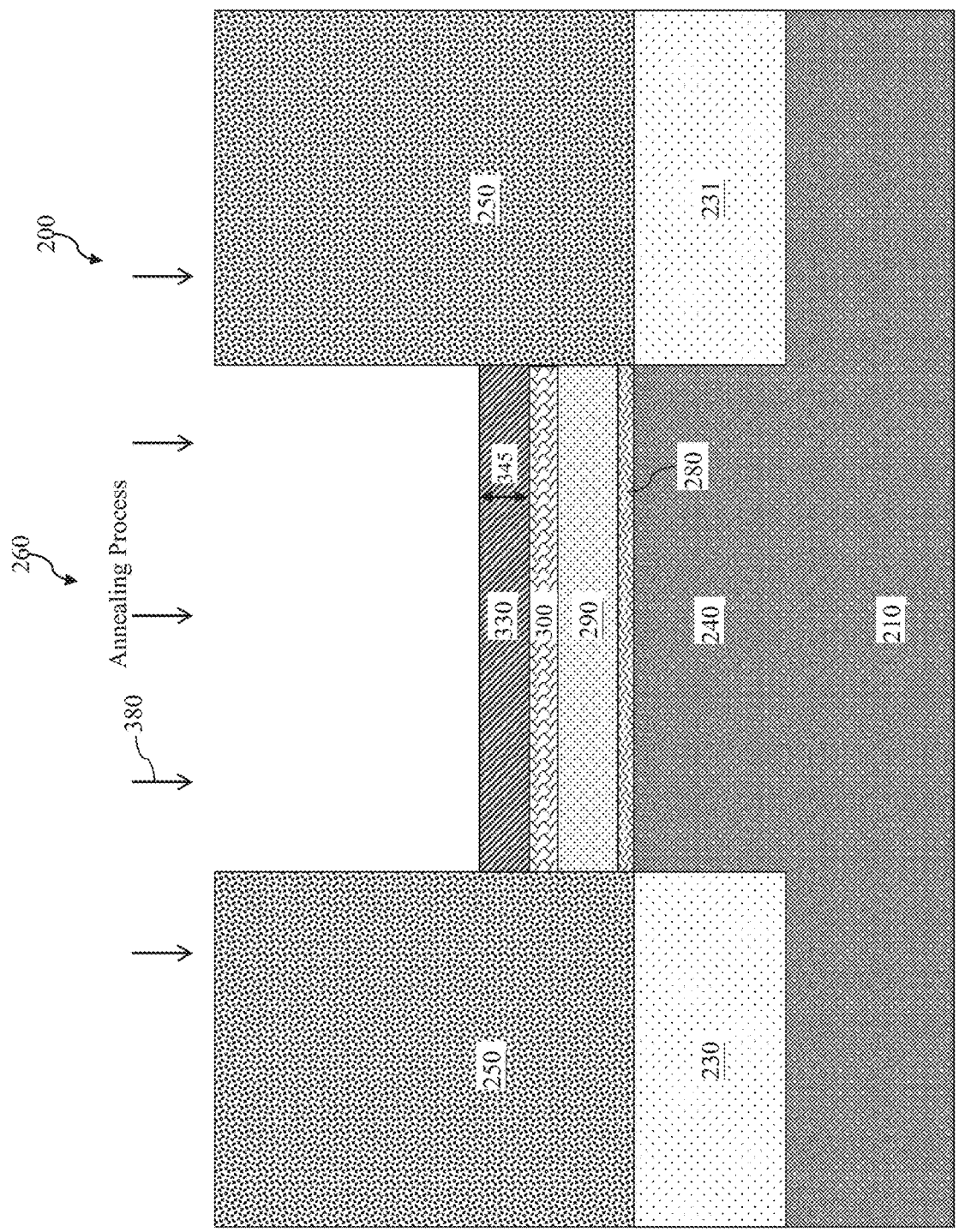

Referring now to FIG. 6, following the formation of the ferroelectric layer 330, an annealing process 380 is performed to the semiconductor device 200. As discussed above, in conventional device, the annealing process 380 could have caused the dopants from the ferroelectric layer 330 to diffuse outwards, for example into the layers below. However, the diffusion blocking layer 300 of the present disclosure prevents or reduces the dopants of the ferroelectric layer 330 from being diffused into the high-k dielectric layer 290, or the interfacial layer 280, or the channel region 240.

Figure 7:
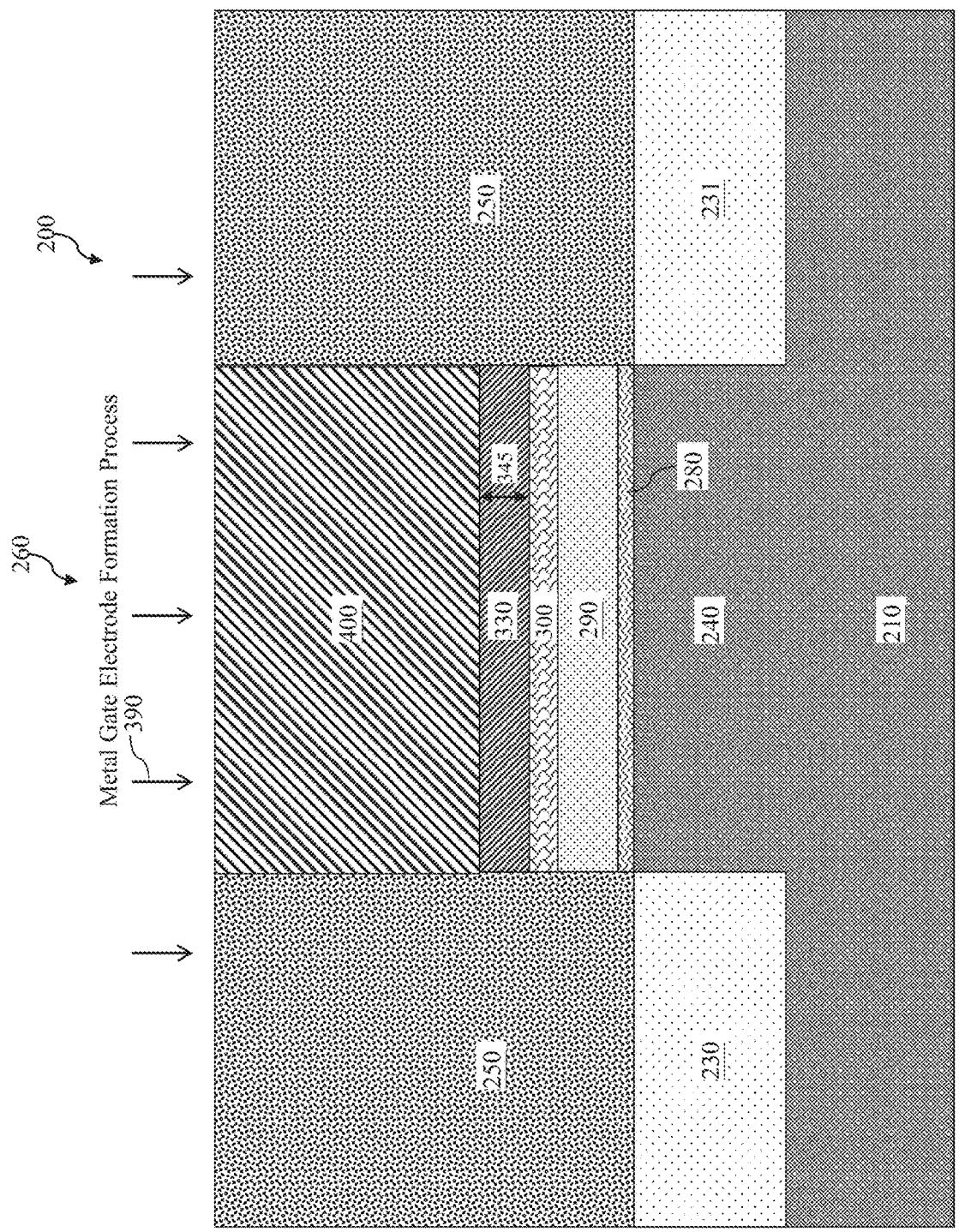

Referring now to FIG. 7, a metal gate electrode formation process 390 is performed to form a metal gate electrode 400 in the opening 260. The metal gate electrode formation process 390 may include a plurality of deposition processes, for example chemical vapor deposition (CVD), atomic layer deposition (ALD), physical vapor deposition (PVD), or combinations thereof. The metal gate electrode 400 may include a work function metal component and a fill metal component. The work functional metal component is configured to tune a work function of its corresponding transistor to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

The metal gate electrode formation process 390 may also include one or more annealing processes. For example, in some embodiments, the work function metal component and/or the fill metal component may include a plurality of metal layers. In these embodiments, a respective annealing process may be performed after the deposition of each metal layer of the metal gate electrode. The purposes of these annealing processes may include (but are not limited to): lowering interface defects, crystalizing amorphous films, or adjusting or tuning threshold voltages (for example, for better chip reliability). As discussed above, the annealing processes may also unintentionally lead to dopant diffusion (from the ferroelectric layer 330 into one or more layers disposed therebelow) in conventional devices. However, the diffusion blocking layer 300 prevents or reduces such dopant diffusion, thereby improving the quality and performance of the semiconductor device 200.

Figure 7A:
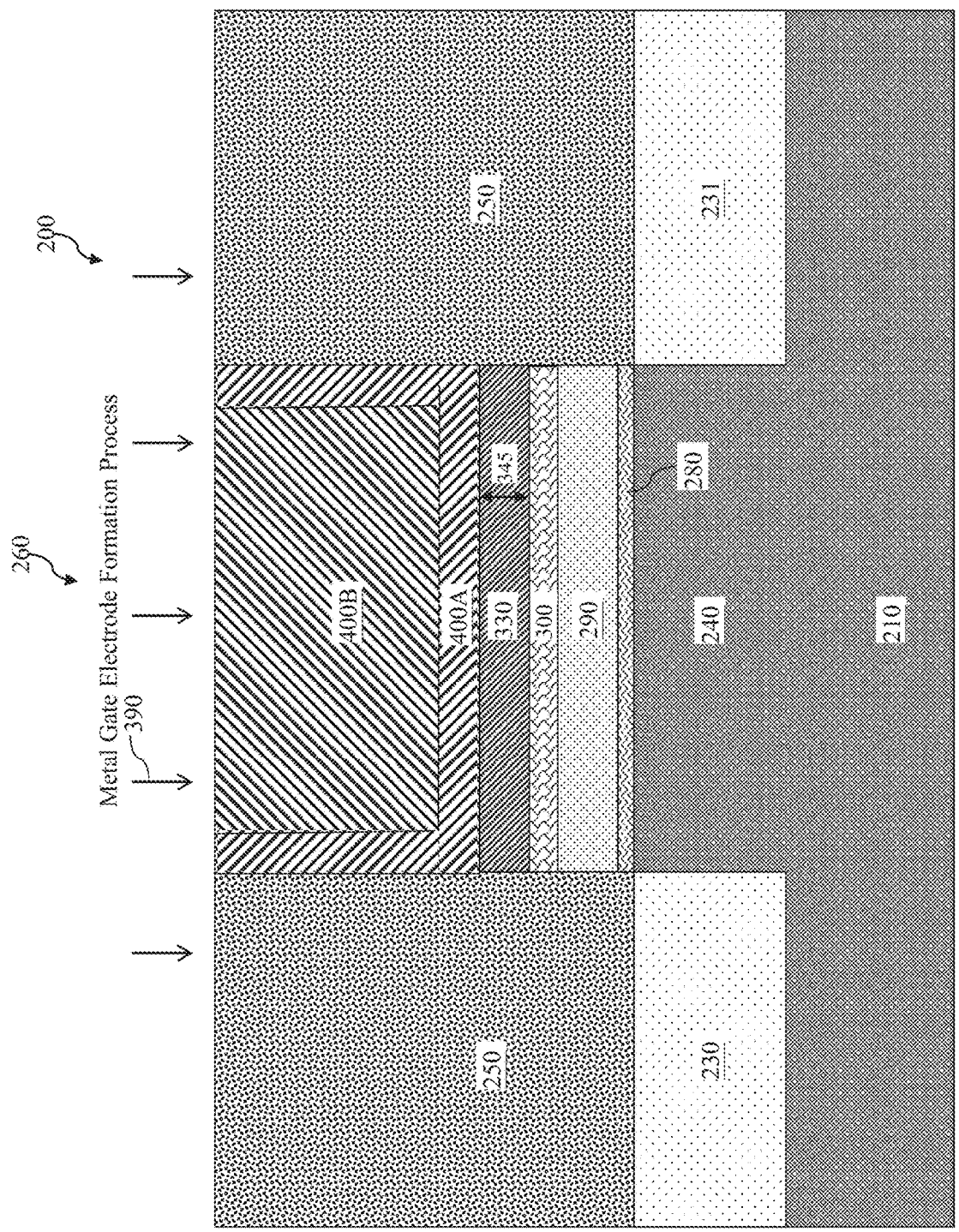
Figure 8:
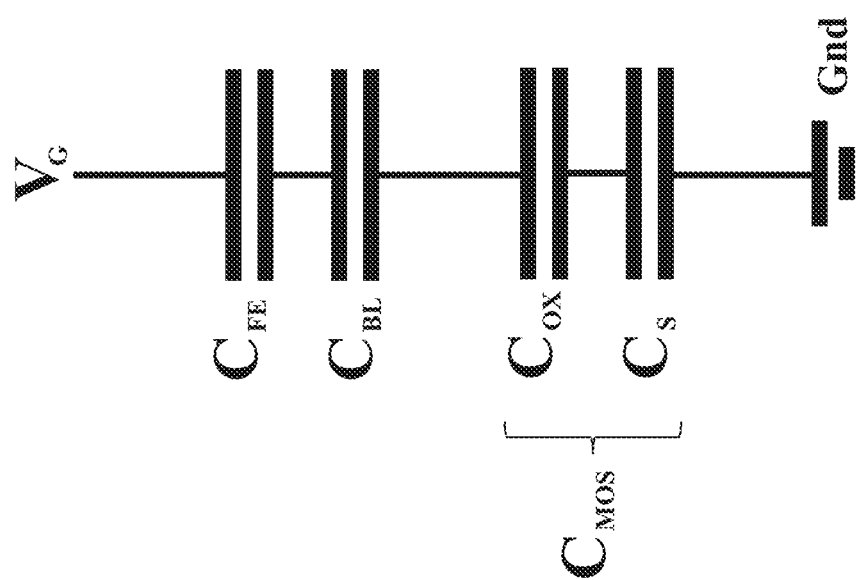
FIG. 8 is a capacitance model of a semiconductor device in accordance with some embodiments.

It is understood that in some embodiments, one or more of the layers 280-330 and/or the metal gate electrode 400 formed in the opening 260 may have a "U-shape" cross-sectional profile. For example, some of these layers 280-330 and/or the layers of the metal gate electrode 400 may have portions that are formed on the sidewalls of the openings 260. For example, as shown in FIG. 7A, the metal gate electrode 400 may include one or more work function metal layers 400A and a fill metal component, as discussed above. The one or more work function metal layers 400A may be formed on the sidewalls of the opening 260 and on the layer 330 and therefore have a U-shape, and the fill metal component 400B may be formed over the one or more work function metal layers 400A. In addition, it is understood that additional fabrication processes may be performed to complete the fabrication of the semiconductor device 200. For example, a multi-layered interconnect structure may be formed to provide electrical interconnections to the various components of the semiconductor device 200. Other processes such as testing or packaging may also be performed. These additional processes are also not specifically illustrated herein for reasons of simplicity.

The implementation of the diffusion blocking layer 300 offers benefits other than reduction in dopant diffusion. Another benefit is more flexibility with respect to capacitance matching. For example, referring now to FIG. 8, a simplified capacitance model of a negative capacitance transistor is illustrated according to aspects of the present disclosure. The negative capacitance transistor may be an embodiment of the semiconductor device 200, that is, a negative capacitance transistor having the diffusion blocking layer 300 sandwiched between the high-k dielectric layer 290 and the ferroelectric layer 330.

The capacitance model corresponds to a portion of the negative capacitance transistor between ground (Gnd) and a gate voltage (Vg) node. A capacitance of the MOS transistor is denoted as $C_{MOS}$, which is made up of a gate oxide capacitance Cox and a depletion region capacitance $C_S$. Cox may be determined by the material compositions and/or the thicknesses of the interfacial layer 280 and the high-k dielectric layer 290, and $C_S$ may be determined by the process conditions and designs of the source/drain regions 230-231 and the channel region 240. The capacitance model further includes $C_{FE}$, which represents a capacitance of the ferroelectric layer 330, as well as $C_{BL}$, which represents a capacitance of the diffusion block layer 300. $C_{FE}$ may be determined by the material composition and/or the thickness of the ferroelectric layer 330, and $C_{BL}$ may be determined by the material composition and/or the thickness of the diffusion blocking layer 300.

In order to optimize the performance of negative capacitance devices, capacitance matching may be needed. For example, the various capacitances discussed above may be adjusted based on factors such as thickness or material composition. Since conventional negative capacitance devices lack the diffusion blocking layer 300, the implementation of the diffusion blocking layer 300 herein offers an additional element for capacitance matching or tuning. In other words, whereas conventional negative capacitance devices can only rely on $C_{MOS}$ and $C_{FE}$ for capacitance tuning, the present disclosure can use not only $C_{MOS}$ and $C_{FE}$ for capacitance tuning, but also $C_{BL}$ as well. In addition, the interfacial layer (which contributes to $C_{MOS}$) does not provide much capacitance tuning flexibility, since it typically has a lower dielectric constant and may be confined to be within a certain thickness range by design requirements. Likewise, the process conditions and/or source/drain/channel design layer (which also contribute to $C_{MOS}$) may not be flexibly changed either, which further limits the capacitance matching or tuning flexibility of conventional negative capacitance devices. In comparison, the material composition and the thickness of the diffusion blocking layer 300 implemented herein can be flexibly changed depending on the capacitance tuning requirements. If any changes need to be made to other layers, for example to the ferroelectric layer for it to achieve specific ferroelectric properties with respect to remanent polarization or coercivity, the material composition and/or the thickness of the diffusion blocking layer 300 may be adjusted accordingly to compensate for the changes in $C_{FE}$. As such, the implementation of the diffusion blocking layer improves capacitance matching in addition to blocking dopant diffusion.

FIGS. 9A-9C illustrate remanent polarization v.s. coercive field plots of various materials. For example, FIG. 9A is a graph illustrating remanent polarization (Y-axis) v.s. coercive field (X-axis) for hafnium oxide. The hafnium oxide material is associated with a monolithic phase. FIG. 9B is a graph illustrating remanent polarization v.s. coercive field for zirconium oxide. The zirconium oxide has a tetragonal phase. FIG. 9C is a graph illustrating remanent polarization v.s. coercive field for hafnium oxide doped with zirconium. The hafnium oxide doped with zirconium has an orthorhombic phase. As is seen in FIG. 9C, the graph of remanent polarization v.s. coercive field for hafnium oxide doped with zirconium has a hysteresis, shaped similar to an S-curve. This is what is desired for a negative capacitance ferroelectric material, and it may be achieved by capacitance tuning. As discussed above, the diffusion blocking layer 300 provides an extra element for capacitance tuning and thus may facilitate the achievement of the hysteresis.

It is understood that the various aspects of the present disclosure apply not only to traditional planar devices, but also to the more recently developed 3-D FinFET transistors as well. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety.

Figure 10:
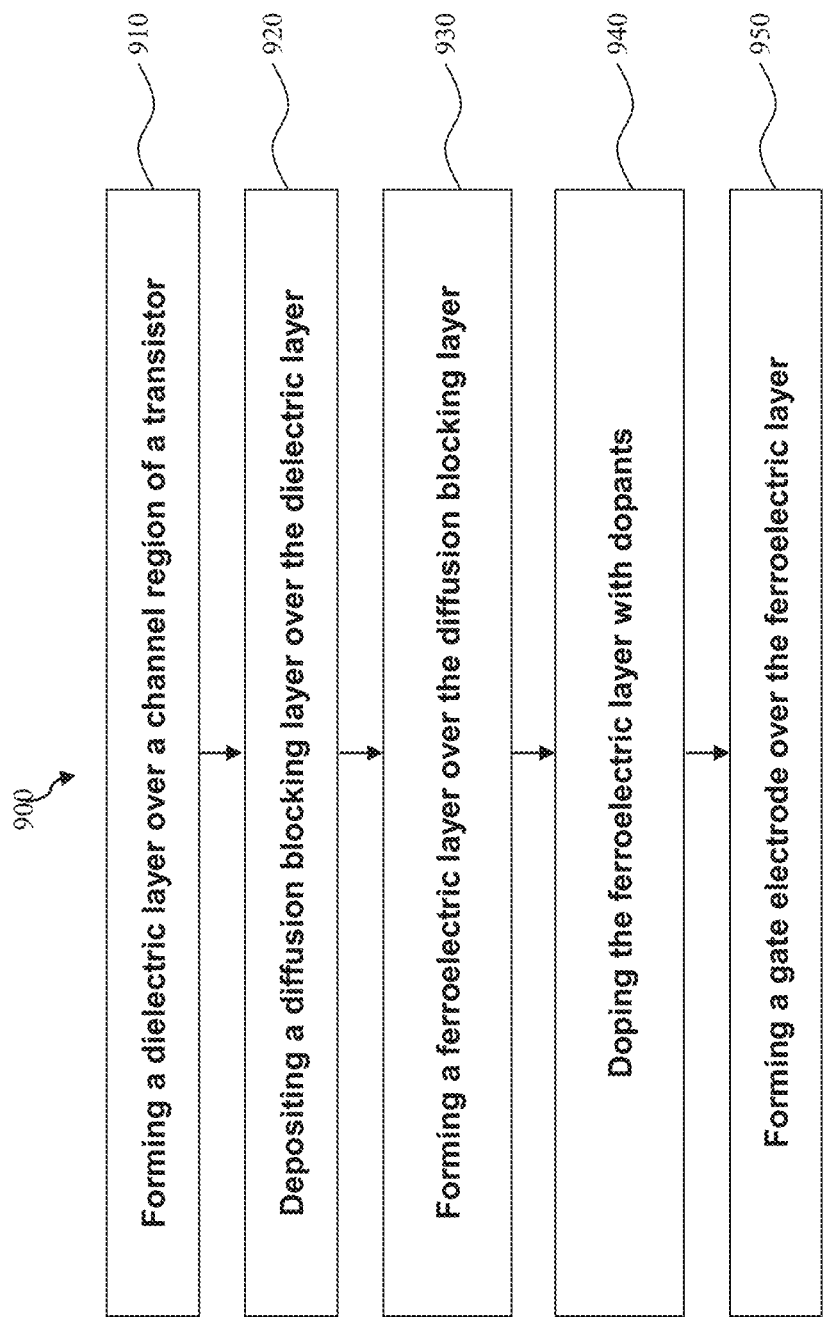
FIG. 10 is a flowchart of an example method for fabricating a semiconductor device constructed in accordance with some embodiments.

FIG. 10 is a flowchart of a method 900 of fabricating a semiconductor device. The method 900 includes a step 910 of forming a dielectric layer over a channel region of a transistor. In some embodiments, the forming of the dielectric layer comprises depositing a dielectric layer having a dielectric constant greater than a dielectric constant of silicon dioxide, for example hafnium oxide.

The method 900 includes a step 920 of depositing a diffusion blocking layer over the dielectric layer. In some embodiments, the diffusion blocking layer may be formed by an atomic layer deposition (ALD) process. In some embodiments, the forming of the diffusion blocking layer comprises forming aluminum oxide, tantalum oxide, titanium oxide, lanthanum oxide, or praseodymium oxide as the diffusion blocking layer.

The method 900 includes a step 930 of forming a ferroelectric layer over the diffusion blocking layer. In some embodiments, the forming of the ferroelectric layer comprises depositing a material that contains hafnium zirconium oxide, hafnium silicon oxide, hafnium aluminum oxide, lead zirconium titanium oxide, or barium titanium oxide.

The method 900 includes a step 940 of doping the ferroelectric layer with dopants. In some embodiments, the dopants include zirconium, silicon, aluminum, lead, barium, or titanium. It is understood, however, that in some embodiments, the ferroelectric layer may already be doped when the step 930 is performed. In other words, the step 930 deposits an already-doped ferroelectric layer, and thus the step 940 of doping the ferroelectric layer may be skipped in some embodiments.

The method 900 includes a step 950 of forming a gate electrode over the ferroelectric layer. In some embodiments, the step 950 of forming of the gate electrode comprises performing one or more annealing processes, wherein the diffusion blocking layer reduces dopant diffusion from the ferroelectric layer into the dielectric layer during the one or more annealing processes. In some embodiments, the forming of the gate electrode comprises forming a plurality of metal layers, where a respective one of the one or more annealing processes is performed after a formation of each of the metal layers, and wherein the diffusion blocking layer reduces the dopant diffusion during each of the one or more annealing processes.

It is understood that additional processes may be performed before, during, or after the steps 910-950 of the method 900. For example, the method 900 may include a step of, before the step 910 of forming the dielectric layer: forming an interfacial oxide layer over the channel region, wherein the dielectric layer is formed over the interfacial oxide layer. As another example, a further annealing process may be performed after the ferroelectric layer is formed but before the gate electrode is formed, wherein the diffusion blocking layer reduces the dopant diffusion during the further annealing process. As another example, the method may include performing a gate replacement process in which a dummy gate structure is removed, and the steps 910-950 are formed thereafter to form a functional gate structure to replace the removed dummy gate structure. As yet another example, an interconnect structure may be formed to couple various devices into a functional circuit. The interconnection structure may include metal lines distributed in multiple metal layers, contacts to connect the metal lines to devices (such as sources, drains and gates), and vias to vertically connect metal lines in the adjacent metal layers. The formation of the interconnect structure may include damascene process or other suitable procedure. The metal components (metal lines, contacts and vias) may include copper, aluminum, tungsten, metal alloy, silicide, doped polysilicon, other suitable conductive materials, or a combination thereof. Other processes may include processes such as testing and packaging. For reasons of simplicity, these additional steps are not discussed herein in detail.

In summary, the present disclosure forms a negative capacitance capacitor that includes: an interfacial layer formed over a channel region in a substrate, a high-k dielectric layer formed over the interfacial layer, a diffusion blocking layer formed over the high-k dielectric layer, a ferroelectric layer (doped with dopants) formed over the diffusion blocking layer, and a metal gate electrode formed over the ferroelectric layer. The diffusion blocking layer has a different material composition from the high-k dielectric layer (though the diffusion blocking layer itself may also have a relatively high dielectric constant). At least the diffusion blocking layer is not implemented in conventional negative capacitance devices. According to the various aspects of the present disclosure, the material composition of the diffusion blocking layer is specifically configured to prevent or reduce dopants from the ferroelectric layer from diffusing outwards, so that the dopants would not diffuse into the layers below, such as the high-k dielectric layer, the interfacial layer, or the channel region.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is improved device performance. For example, the fabrication of negative capacitance devices may involve one or more high temperature annealing processes, which may be performed after the formation of the ferroelectric layer and/or during the formation of the metal gate electrode. In conventional negative capacitance devices, dopants from a ferroelectric layer may diffuse into layers below (e.g., a high-k gate dielectric, an interfacial layer, or even a channel region) as a result of these high temperature annealing processes. The dopants contaminate these layers and may degrade device performance. According to the present disclosure, the diffusion blocking layer substantially prevents or reduces such dopant diffusion, which maintains the purity of the layers below the ferroelectric layer. Consequently, device performance is improved compared to conventional devices. Another advantage is more flexibility with respect to capacitance matching. As discussed above, conventional negative capacitance devices lack the diffusion blocking layer, and capacitance matching may be accomplished only by tuning $C_{MOS}$ and/or $C_{FE}$. In comparison, the present disclosure provides an additional component for capacitance matching through the addition of the diffusion blocking layer, which has a capacitance of $C_{BL}$. The extra degree of freedom offered by the diffusion blocking layer means that parameters such as remanent polarization and/or coercive field of the negative capacitance device may be tuned to achieve optimal performance. Other advantages include compatibility with existing fabrication processes and low cost of implementation.

One aspect of the present disclosure provides a semiconductor device. The semiconductor device includes a substrate. The semiconductor device includes a dielectric layer disposed over a portion of the substrate. The semiconductor device includes a diffusion blocking layer disposed over the dielectric layer. The diffusion blocking layer and the dielectric layer have different material compositions. The semiconductor device includes a ferroelectric layer disposed over the diffusion blocking layer.

Another aspect of the present disclosure provides a semiconductor device. A channel region is formed in a substrate. A gate dielectric layer is located over the channel region. The gate dielectric layer has a dielectric constant greater than a dielectric constant of silicon dioxide. An interfacial oxide layer is disposed between the channel region and the gate dielectric layer. A diffusion blocking layer is located over the gate dielectric layer. The diffusion blocking layer and the gate dielectric layer contain different types of high-k dielectric materials. A ferroelectric layer is located over the diffusion blocking layer. The ferroelectric layer contains dopants. A material composition of the diffusion blocking layer is configured to be non-reactive with the dopants and to reduce dopant diffusion from the ferroelectric layer into the gate dielectric layer. A metal gate electrode is located over the ferroelectric layer. The semiconductor device is a negative capacitance device.

Yet another aspect of the present disclosure provides a method of fabricating a semiconductor device. A dielectric layer is formed over a channel region of a transistor. A diffusion blocking layer is deposited over the dielectric layer. A ferroelectric layer is formed over the diffusion blocking layer. The ferroelectric layer contains dopants. A gate electrode is formed over the ferroelectric layer. One or more annealing processes occurs after the forming of the ferroelectric layer and before or during a formation of the gate electrode. The diffusion blocking layer reduces dopant diffusion from the ferroelectric layer into the dielectric layer during the one or more annealing processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a substrate;
   a first layer disposed over a portion of the substrate, wherein the first layer contains a dielectric material having a dielectric constant greater than a dielectric constant of silicon oxide;

a second layer disposed over the first layer, wherein the second layer contains a metal oxide or a metal nitride, wherein the second layer includes a plurality of sub-layers that each have a different material composition; and a third layer disposed over the second layer, wherein the third layer contains a ferroelectric material;

wherein the first layer, the second layer, and the third layer are portions of a gate.

2. The semiconductor device of claim 1, wherein the gate is a gate of a negative capacitance transistor.

3. The semiconductor device of claim 1, further comprising a metal-containing gate electrode disposed over the third layer.

4. The semiconductor device of claim 1, wherein the second layer contains: aluminum oxide, tantalum oxide, titanium oxide, lanthanum oxide, praseodymium oxide, aluminum nitride, tantalum nitride, titanium nitride, lanthanum nitride, or praseodymium nitride.

5. The semiconductor device of claim 1, wherein the ferroelectric material includes an oxide material doped with a dopant.

6. The semiconductor device of claim 5, wherein:
the oxide material of the ferroelectric material includes: hafnium zirconium oxide, hafnium silicon oxide, hafnium aluminum oxide, lead zirconium titanium oxide, or barium titanium oxide; and
the dopant of the ferroelectric material includes zirconium, silicon, aluminum, lead, barium, titanium, or a polymer.

7. The semiconductor device of claim 1, wherein:
at least one of the sub-layers of the second layer contains aluminum oxide; and
the third layer contains a hafnium-based material doped with a zirconium dopant.

8. The semiconductor device of claim 1, wherein the second layer has a dielectric constant in a range between about 15 and about 60.

9. The semiconductor device of claim 1, wherein a thickness of the second layer is in a range between about 1 nanometer and about 3 nanometers.

10. A semiconductor device, comprising:
a substrate;
a high-k dielectric layer disposed over a portion of the substrate, wherein the high-k dielectric layer contains a dielectric material having a dielectric constant greater than a dielectric constant of silicon oxide;
a plurality of diffusion-blocking layers disposed over the high-k dielectric layer, wherein each of the diffusion-blocking layers contains a metal oxide or a metal nitride, and wherein the diffusion-blocking layers have different material compositions from one another; and
a ferroelectric layer disposed over the diffusion-blocking layers, wherein the ferroelectric layer has a different material composition than each of the diffusion-blocking layers; and
a metal gate electrode disposed over the ferroelectric layer.

11. The semiconductor device of claim 10, wherein each of the diffusion-blocking layers contains: aluminum oxide, tantalum oxide, titanium oxide, lanthanum oxide, praseodymium oxide, aluminum nitride, tantalum nitride, titanium nitride, lanthanum nitride, or praseodymium nitride.

12. The semiconductor device of claim 10, wherein the ferroelectric layer includes a hafnium-based material that is doped with zirconium, silicon, aluminum, lead, barium, titanium, or a polymer.

13. The semiconductor device of claim 10, wherein the diffusion layers each have a dielectric constant in a range between about 15 and about 60.

14. The semiconductor device of claim 10, the ferroelectric layer contains a hafnium-based material doped with a zirconium dopant.

15. A method, comprising:
depositing a dielectric layer over a channel region of a transistor, wherein the dielectric layer contains a dielectric material having a dielectric constant greater than a dielectric constant of silicon oxide;
depositing a diffusion-blocking structure that includes a plurality of diffusion-blocking layers over the dielectric layer, wherein the diffusion-blocking layers each contains a metal oxide or a metal nitride material, and wherein the diffusion-blocking layers each have a different material composition;
depositing a hafnium-based layer over the diffusion-blocking structure, and wherein the hafnium-based layer has a different material composition than the diffusion-blocking structure;
doping the hafnium-based layer with a dopant; and
performing a first annealing process during or after the depositing of the hafnium-based layer, wherein the first annealing process causes the dopant to diffuse out of the hafnium-based layer.

16. The method of claim 15, wherein the diffusion-blocking structure reduces a diffusion of the dopant from the hafnium-based layer into the dielectric layer during the first annealing process.

17. The method of claim 15, further comprising: forming a metal gate electrode over the hafnium-based layer, wherein the forming of the metal gate electrode includes performing a second annealing process.

18. The method of claim 17, wherein the diffusion-blocking structure reduces a diffusion of the dopant from the hafnium-based layer into the dielectric layer during the second annealing process.

19. The method of claim 15, wherein the depositing the diffusion-blocking structure comprises depositing aluminum oxide, tantalum oxide, titanium oxide, lanthanum oxide, praseodymium oxide, aluminum nitride, tantalum nitride, titanium nitride, lanthanum nitride, or praseodymium nitride as the diffusion-blocking structure.

20. The method of claim 15, wherein the doping comprises doping the hafnium-based layer with zirconium, silicon, aluminum, lead, barium, titanium, or a polymer.

* * * * *